(12) United States Patent
Van Zyl (10) Patent No.: US 10,742,212 B2
(45) Date of Patent: Aug. 11, 2020

(54) PIN DIODE DRIVER WITH ENERGY RECOVERY

(71) Applicant: Advanced Energy Industries, Inc., Fort Collins, CO (US)

(72) Inventor: Gideon Johannes Jacobus Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 16/293,414

(22) Filed: Mar. 5, 2019

(65) Prior Publication Data

US 2019/0273496 A1 Sep. 5, 2019

Related U.S. Application Data

(60) Provisional application No. 62/638,730, filed on Mar. 5, 2018.

(51) Int. Cl.
*H03K 17/74* (2006.01)
*H01L 29/868* (2006.01)
*H03K 17/567* (2006.01)

(52) U.S. Cl.
CPC .......... *H03K 17/74* (2013.01); *H01L 29/868* (2013.01); *H03K 17/567* (2013.01); *H03K 2217/0036* (2013.01)

(58) Field of Classification Search
CPC ................ H03K 17/74; H03K 17/567; H03K 2217/0036; H01L 29/868
See application file for complete search history.

(56) References Cited

U.S. PATENT DOCUMENTS 4,196,381 A * 4/1980 Standing ............... H01P 1/15
323/350
4,486,722 A 12/1984 Landt

OTHER PUBLICATIONS

International Searching Authority, International Search Report and Written Opinion, issued for International Application No. PCT/US2019/020800, dated May 14, 2019 (10 pages).

* cited by examiner

*Primary Examiner* — John W Poos
(74) *Attorney, Agent, or Firm* — Polsinelli PC (57) ABSTRACT

A controller for a PIN diode coupled to a forward bias supply in series with an inductor by way of a first switch and coupled with a reverse bias supply in series with the inductor by way of a second switch. In reverse biasing the PIN diode, energy is recovered from the PIN diode, and possibly other components such as a reactance element (e.g., capacitor) coupled with the PIN diode, by momentarily disconnecting the reverse bias supply. In forward biasing the PIN diode, energy is recovered from the PIN diode, and possibly other components, by momentarily disconnecting the forward bias supply.

17 Claims, 12 Drawing Sheets

```
                                    ┌──────────────────────────────────────────────┐
                            500      │ TURN OFF FIRST SWITCH DISCONNECTING FORWARD BIAS │
                              ↰      │ SUPPLY FROM PIN DIODE THROUGH INDUCTOR DEVICE │
                                     │                                          502 │
                                     └──────────────────────┬───────────────────────┘
                                                            ▼
                            ┌──────────────────────────────────────────────────────┐
                            │ AFTER A DELAY SUFFICIENT FOR FIRST SWITCH TO TURN OFF, │
                            │ TEMPORARILY TURN ON SECOND SWITCH CONNECTING          │
                            │ REVERSE BIAS SUPPLY TO INDUCTOR DEVICE AND PIN DIODE  │
                            │                                                  504  │
                            └──────────────────────┬───────────────────────────────┘
                                                   ▼
                            ┌──────────────────────────────────────────────────────┐
                            │ AFTER A TIME PERIOD SUFFICIENT STORE ENERGY IN THE   │
                            │ INDUCTOR TO COMPLETE THE ON TO OFF TRANSITION OF THE │
                            │ PIN DIODE, TURN OFF THE SECOND SWITCH                │
                            │                                                  506 │
                            └──────────────────────┬───────────────────────────────┘
                                                   ▼
                            ┌──────────────────────────────────────────────────────┐
                            │ CURRENT FLOWS THROUGH DIODE PARALLEL TO FIRST SWITCH │
                            │ TO RECOVER ENERGY, WHICH MAY BE RECOVERED TO         │
                            │ FORWARD BIAS SUPPLY                                  │
                            │                                                  508 │
                            └──────────────────────┬───────────────────────────────┘
                                                   ▼
                            ┌──────────────────────────────────────────────────────┐
                            │ TURN ON SECOND SWITCH AT TIME WHEN INDUCTOR CURRENT  │
                            │ STOPS FLOWING, THE SECOND SWITCH CONNECTING THE      │
                            │ REVERSE BIAS SUPPLY TO THE PIN DIODE THROUGH THE     │
                            │ INDUCTOR DEVICE TO COMPLETE REVERSE BIASING OF THE PIN│
                            │ DIODE                                            510 │
                            └──────────────────────────────────────────────────────┘
```

PIN DIODE DRIVER WITH ENERGY RECOVERY

CROSS-REFERENCE TO RELATED APPLICATION

This application is related to and claims priority under 35 U.S.C. § 119(e) from U.S. Patent Application No. 62/638,730, filed Mar. 5, 2018 entitled "Pin Diode Driver with Energy Recovery," the entire contents of which is incorporated herein by reference for all purposes.

TECHNICAL FIELD

Embodiments of the present invention generally relate to PIN diode driver circuits.

BACKGROUND

PIN diodes are used in many different applications. In one particular example, PIN diodes may be used in matching networks to match the impedance of a load to an impedance into which a high power radio frequency generator can deliver power. Regardless of the specific use, high speed switching of PIN diodes may involve high power consumption each switch cycle, which is exacerbated in devices using multiple PIN diodes. It is with these observations in mind, among others, that aspects of the present disclosure were conceived.

SUMMARY

Embodiments of the present invention generally relate to systems and methods for radio-frequency (RF) switching circuits, and more particularly for a PIN diode driver circuit for high speed, high repetition rate, high power applications. In one example, an embodiment involves a method for driving a PIN diode. In a circuit including an inductor device switchably connectable between a forward bias supply and a PIN diode using a first switch and between a reverse bias supply and the PIN diode using a second switch, the method involves opening the first switch to disconnect the forward bias supply from the inductor device and the PIN diode and, after the opening of the first switch, closing the second switch to connect the reverse bias supply to the inductor device and the PIN diode to initiate reverse biasing of the PIN diode. During reverse biasing of the PIN diode and in the presence of a reverse current, the method involves opening the second switch to recover energy to the forward bias supply. Opening the second switch to recover energy to the forward bias supply may occur after a time period sufficient for the inductor device to store sufficient energy for a transition of the PIN diode from a forward bias state to a reverse bias state. The method may further involve closing the second switch to reconnect the reverse bias supply to the inductor device to complete the reverse bias of the PIN diode.

In another example, an embodiment involves a method for driving a PIN diode. In a circuit including an inductor device switchably connectable between a PIN diode and a forward bias supply using a first switch, and connectable between the PIN diode and a reverse bias supply using a second switch, the method includes opening the second switch to disconnect the reverse bias supply from the PIN diode. After opening the second switch, closing the first switch to connect the forward bias supply to the inductor device and the PIN diode. The method further involves, during forward bias of the PIN diode, opening the first switch to provide energy recovery to the reverse bias supply. Opening the first switch to provide energy recovery to the reverse bias supply may occur after a time period sufficient for the inductor device to store sufficient energy for a transition of the PIN diode from a reverse bias state to a forward bias state. The method may further involve, closing the first switch to reconnect the forward bias supply to the inductor device and the PIN diode when the current through the inductor is about zero or at a forward bias current. The methods may be implemented by a controller.

In one example, an apparatus includes a controller coupled with a first semiconductor switch device and a second semiconductor switch device, where the first semiconductor switch device is to connect a forward bias supply with an inductor device in series with a PIN diode and the second semiconductor device is to connect a reverse bias supply with the inductor device in series with the PIN diode. The controller includes instructions to: in reverse biasing the PIN diode, after opening the first semiconductor switch device, close the second semiconductor switch device to connect the reverse bias supply to the inductor device and the PIN diode to initiate reverse biasing of the PIN diode. During reverse biasing of the PIN diode and in the presence of a reverse current, the controller opens the second semiconductor switch device to recover energy to the forward bias supply.

In forward biasing the PIN diode, the controller including instructions to: open the second semiconductor switch device to disconnect the reverse bias supply from the inductor device and the PIN diode, and after opening the second semiconductor switch device, close the first semiconductor switch device to connect the forward bias supply to the inductor device and the PIN diode. During forward biasing of the PIN diode, the controller opens the first switch to provide energy recovery to the reverse bias supply.

These and other aspects of the present disclosure are described below.

DETAILED DESCRIPTION

A PIN diode is an electrical diode device with an un-doped or lightly doped intrinsic (I) semiconductor region sandwiched between a heavily doped p-type semiconductor region (P) and a heavily doped n-type semiconductor region (N); hence, the "PIN diode" designation. In general, PIN diodes obey conventional diode behavior at low frequency input signals, but operate as a resistor in the forward biased or on-state and as a small capacitor in the reverse biased or off-state at higher frequency input signals. As such, PIN diodes are often utilized in attenuators, fast switches, radio frequency (RF) applications, and high voltage electronic applications where high isolation and low loss are desired. In one particular implementation, PIN diodes are used in an impedance match network configured to match a changing load impedance of a plasma load to a desired impedance (e.g. 50 ohm) into which a high power RF generator can efficiently deliver power. In such an implementation, the PIN diodes serve to connect or disconnect reactive components, typically capacitors, of the impedance matching network to quickly alter the properties of the matching network by switching the reactive elements in and out of the network.

Figure 1A:
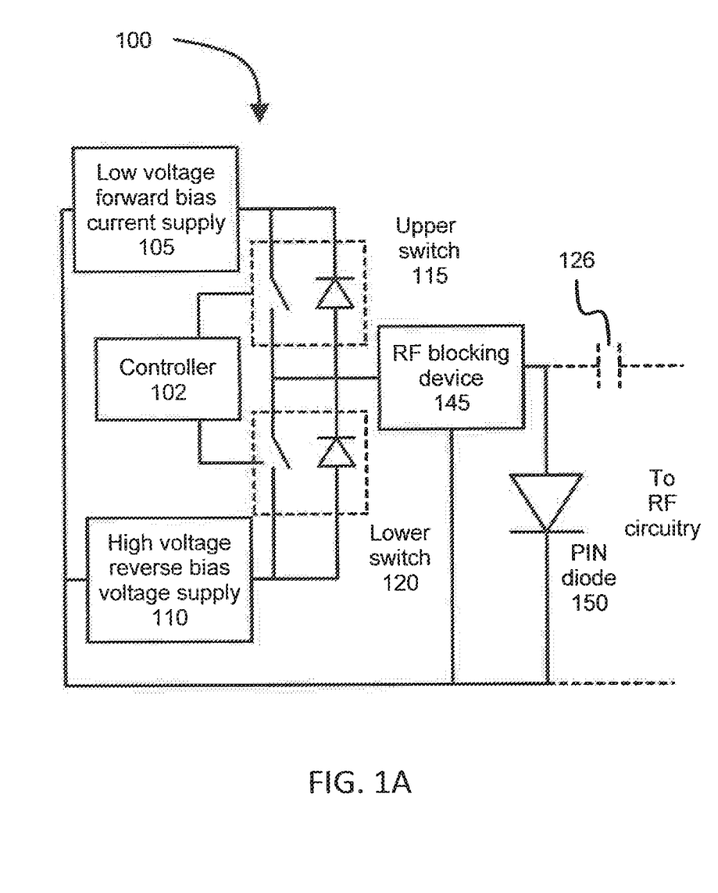
FIGS. 1A-1B illustrates two conventional dual supply PIN diode driver circuits.
Figure 1B:
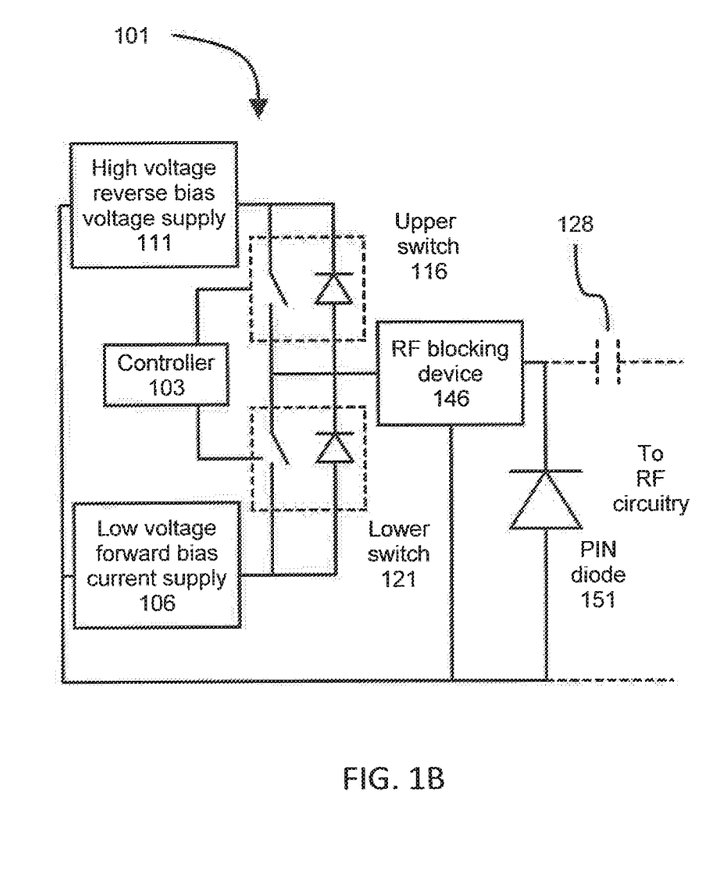

PIN diodes in a switching circuit typically have an accompanying PIN diode driver circuit or switch driver that provides a controlled forward bias current and a reverse bias voltage. For example, FIGS. 1A and 1B illustrate two conventional dual supply PIN diode driver circuits, 100, 101. Each circuit includes a respective PIN-type diode 150, 151, which may in turn be connected to some type of RF circuitry, for example. In FIG. 1A, the power supplies are referenced to the cathode of the PIN diode and the low voltage forward bias current supply 105 provides a positive voltage to the upper switch 115 and the high voltage reverse bias voltage supply 110 provides a negative voltage to the lower switch 120. In contrast, in FIG. 1B, the power supplies are referenced to the anode of the PIN diode and the low voltage forward bias current supply 106 provides a negative voltage to the lower switch 121 and the high voltage reverse bias voltage supply 111 provides a positive voltage to the upper switch 116. Each PIN diode 150, 151 is driven by two power supplies, 105 and 110 for circuit 100, and 106 and 111 for circuit 101. The power supplies 105, 110, 106, and 111 provide a forward bias current and a reverse bias voltage to the respective PIN diodes. For example, in the circuit 100, a low voltage forward bias current supply 105 is connected to a switch 115. When the switch 115 is closed (and switch 120 is open), the forward bias current supply 105 provides a forward bias current to the PIN diode 150. Circuit 100 also includes a high voltage reverse bias voltage supply 110 connected with switch 120. When switch 120 is closed (and switch 115 is opened), the reverse bias voltage supply 110 provides a reverse bias voltage across the PIN diode 150.

Similarly, in circuit 101, a high voltage reverse bias voltage supply 111 is connected to a switch 116 to provide a reverse bias voltage across the PIN diode 151 when switch 116 is closed and a low voltage forward bias current supply 106 provides a forward bias current to the PIN diode 151 when switch 121 is closed. The RF blocking devices 145, 146 in the circuits 100, 101 may include inductors in series between the half bridges formed by the switches 115 and 120 in circuit 100 and switches 116 and 121 in circuit 101 and the PIN diodes 150 and 151, but more generally may be any circuit that passes direct-current (DC) at low frequencies between the half bridges and the PIN diodes, but suppresses the RF frequency applied to the PIN diodes 150, 151 by the RF circuitry. Examples of the type of circuits that may be at position 145, 146 include an RF choke, a parallel resonant LC tank or tanks, a quarter wavelength (at RF frequency) transmission line, etc. The diodes shunting the switches 115, 120, 116, and 121 can be discrete diodes or the intrinsic body diodes present in semiconductor switches (e.g. bipolar junction transistor, MOSFETs) or representing the diode-like reverse behavior of devices like GaN HEMTs.

Figure 2A:
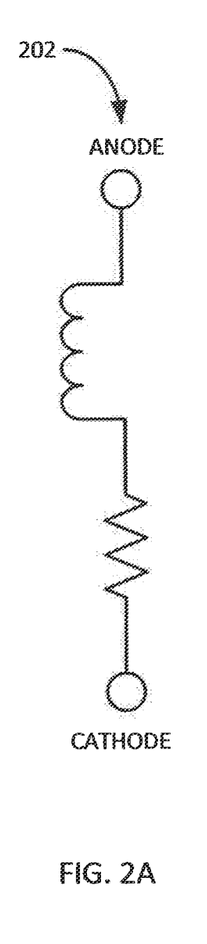
FIGS. 2A-2B illustrates PIN diode equivalent circuits.

Referring to circuit 100 as an example, the operation of the PIN diode circuit is now described. To forward bias the PIN diode 150, switch 115 is closed and switch 120 is open. The low voltage current supply 105 provides a forward bias current to the PIN diode 150. When the PIN diode is forward biased, holes from the P region material and electrons from the N region material of the diode 150 are injected into the sandwiched I-region material. As the charges in the diode 150 cannot recombine instantaneously, a net charge is stored in the I-region. When the forward bias current is removed, the charges in the I-region recombine with a time constant known as the carrier lifetime. The diode thus acts as a resistor with an effective "on" resistance value at RF frequencies above a threshold determined by the properties of the diode. An equivalent forward biased circuit 202 is illustrated in FIG. 2A. For a high power PIN diode designed to operate at 10 MHz, typical values for the elements of circuit 202 may be 1 nH for the inductor and 0.1Ω for the resistor.

Figure 2B:
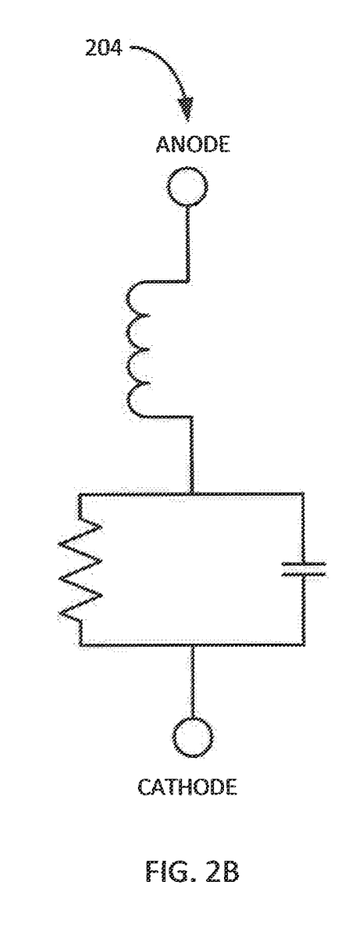

To reverse-bias the PIN diode 150, switch 115 is opened and switch 120 is closed to provide a reverse bias voltage to the PIN diode from the high voltage reverse bias voltage supply 110. In the reverse-biased state, the PIN diode 150 has an equivalent circuit (204 of FIG. 2B) of a large resistor shunted by a small capacitance. For a high power PIN diode designed to operate at 10 MHz, typical values for the elements of circuit 204 may be 1 nH for the inductor, 3 pF for the capacitor and 1 MS) for the resistor. By varying aspects of the PIN diode 150 and the circuit 100, a variety of forward-bias resistance and reverse-bias capacitance may be achieved for specific application in various contexts.

The potential performance issue with conventional operation and configuration of PIN diode driver circuits 100, 101 is that such PIN diode drivers may consume large amounts of power when used in high speed, high repetition rate and/or high power applications. For purposes of illustration, a PIN diode 150 is used in a high power application with frequencies ranging from 3 to 30 MHz. In such examples, the PIN diode 150 may be forward biased with 1 A from the forward bias current supply 105 and reverse biased with −1500 V from the reverse bias voltage supply 110. Conventional PIN diode drivers are not configured to recover energy fed into the circuit and stored in capacitors from the forward bias supply and reverse bias supply. In solid state impedance match networks (SSM) where many PIN diodes are connected to and used to switch many respective capacitors (one capacitor 126 and capacitor 128 are shown in dashed line, as examples, in FIGS. 1A and 1B) in and out of a circuit, considerable energy may be stored in the capacitors of the circuit. For example, assume a circuit with a PIN diode used to switch a 200 pF capacitor in and out of the circuit. The energy stored in such a capacitor at 1500 V is about 225 µJ. In a typical SSM that may include several such PIN diode driver capacitive circuits (e.g., 30 or more), a traditional PIN driver circuit may waste in excess of 33 W when all switches are changed at a 10 kHz rate. Worse yet, a conventional PIN diode switch driver my recover a charge equal to the forward current multiplied by the carrier lifetime, which in a typical case may be 0.5 A×12 μs=6 μC at 1500 V. To quickly (e.g. in a time period shorter than the carrier lifetime) switch from the forward biased (on) state to the reverse biased (off) state, the charge that must be removed from the diode tends to be the product of the forward current and carrier lifetime. In the example referenced immediately above, a charge of 6 μC is to be removed to switch from the forward biased to reverse biased state. The result is that an energy of 9 mJ may be needed to recover the diode from the on state to the off state. If 30 such switches operate at a 10 kHz rate in the SSM network, a power of 1350 W is consumed just for diode recovery from the on to the off state. It is possible to wait before connecting to the high voltage reverse bias power supply in order that some of the stored charge in the PIN diode recombine and thus reduce the power consumed, but there is a trade-off with switching speed in this approach.

To address these performance issues of conventional PIN diode driver circuits generally and also when used in SSM networks, a modified PIN diode driver forward and reverse bias sequence, and where applicable, a circuit with a relatively large inductor, are disclosed herein that recover energy stored in capacitors of an RF circuit and minimizes the power consumed to recover the PIN diode from the on to the off state. In one particular example (for the forward to reverse bias transition), the modified sequence involves turning on the switch to the reverse bias supply for only a short period of time, after forward bias is disconnected, to store just enough energy in the inductor to complete the on to off transition of the PIN diode, allow current to flow through the diode shunting the switch connected to the forward bias supply and, then, finally turning on the switch to the high voltage power supply when the inductor current drops to zero. This sequence, rather than wasting energy, recovers energy stored in the PIN diode (as well as any capacitors attached to the PIN diode in SSM applications) and returns it to the forward bias power supply. In some examples, the modified PIN diode driver circuit may include a relatively large inductor (e.g., 200 μH compared to a typical inductor of 2 μH used for RF blocking) in series between a half bridge circuit (e.g., switches 115 and 120) and the PIN diode (e.g., 150). When choosing an inductor for RF blocking, the inductor value is as a general rule chosen such that the inductor is below or at self-resonance at the RF frequency. Choosing a higher value inductor such that the self-resonant frequency of the inductor is well below the RF frequency is counterproductive from the perspective of blocking RF. The self-resonant frequency of the large inductor 340 in this circuit is normally well below the RF frequency and only serves to achieve the switching performance of the circuit. The inductor, whether relatively large or not, is in series between the forward bias supply and the PIN diode when the forward bias supply is connected, and in series between the reverse bias supply and the PIN diode when the reverse bias supply is connected.

Figure 3:
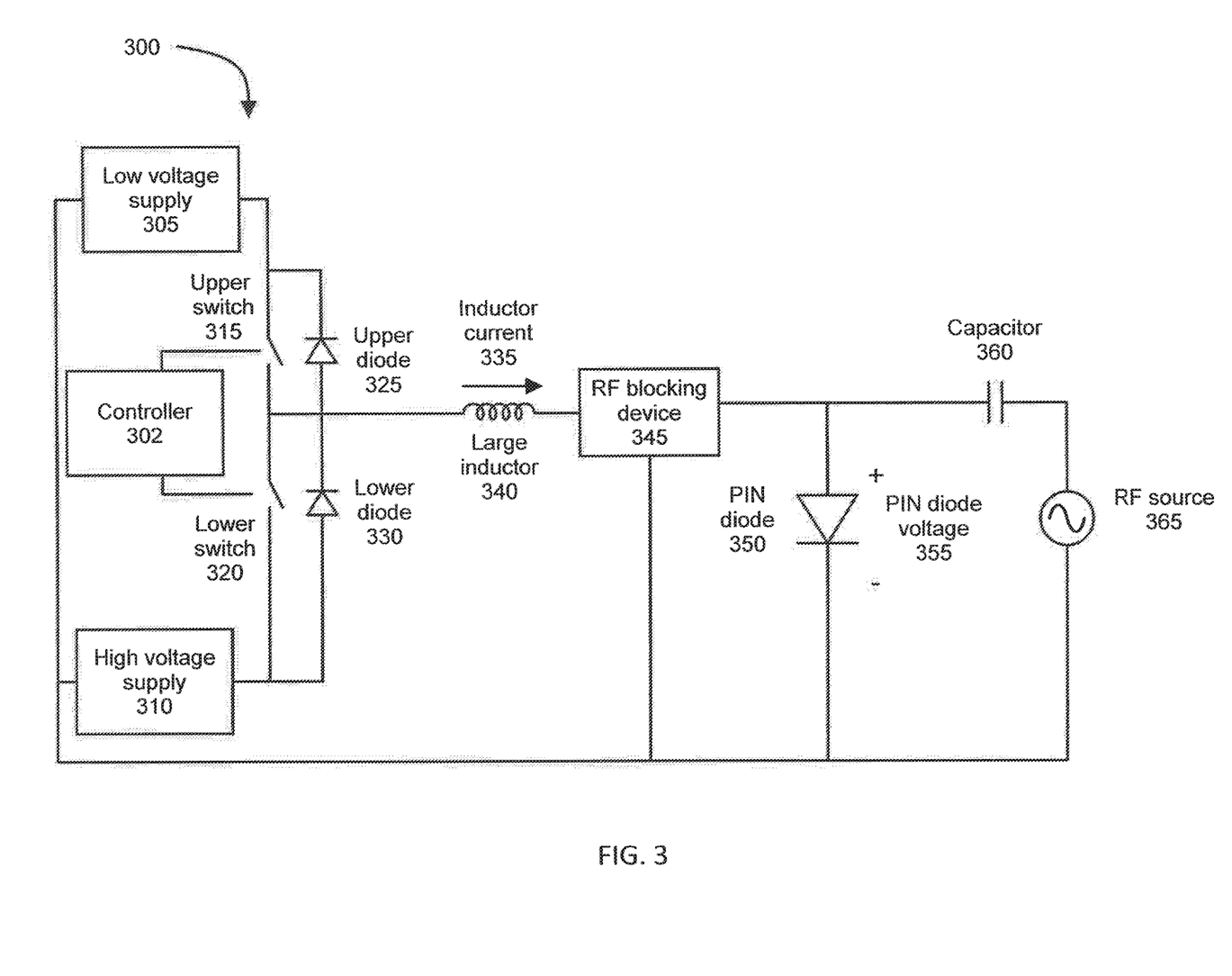
FIG. 3 illustrates a PIN diode driver circuit that includes a large inductor in series between a half bridge and a PIN diode to recover energy from stored charge in a solid state match application.
Figure 4A:
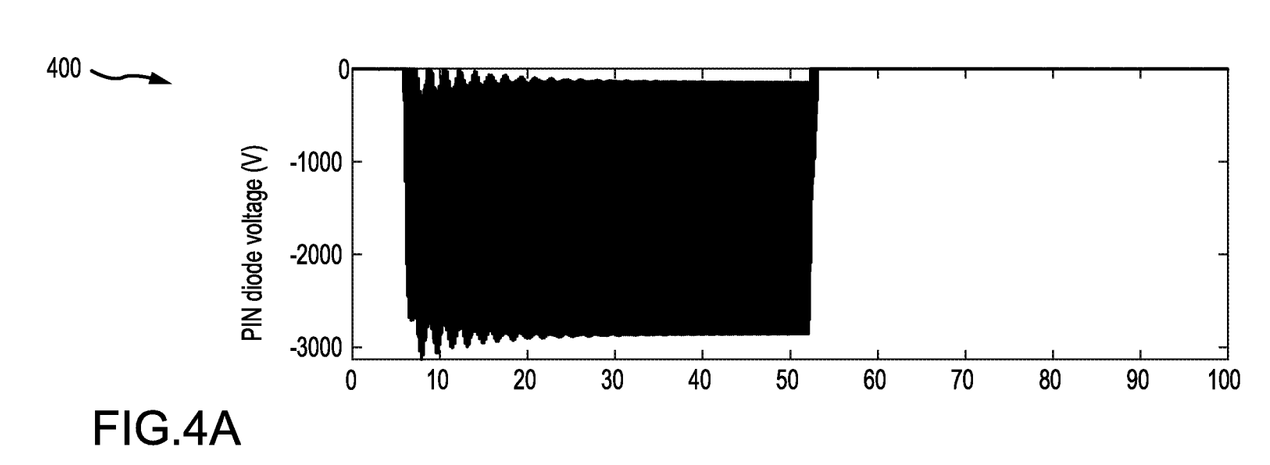
FIG. 4 illustrates performance waveforms of the circuit of FIG. 3 with switches operated to recover energy from stored charge in a solid state match application.
Figure 4B:
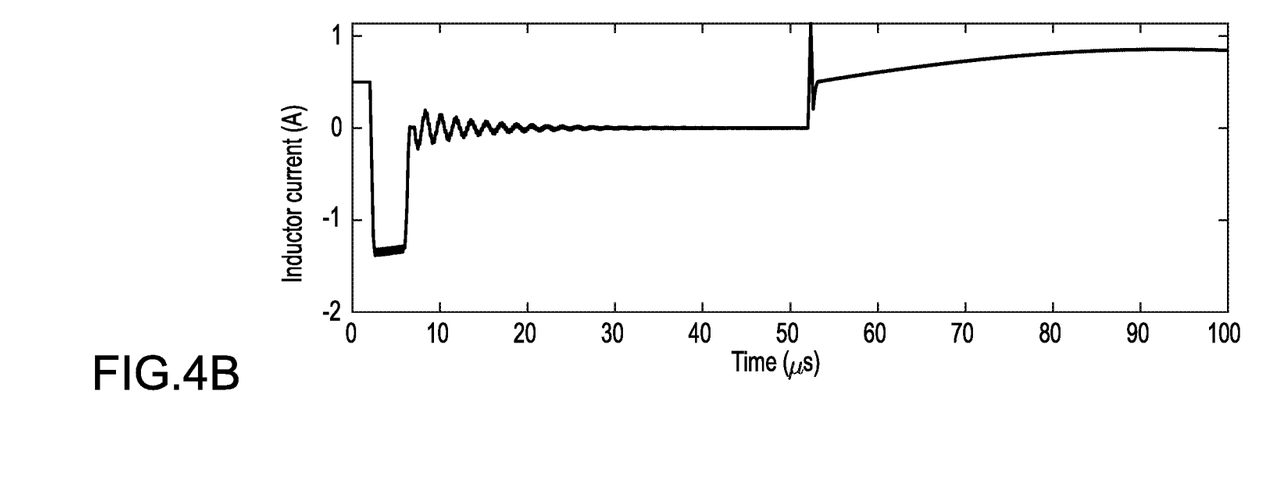
Figure 4C:
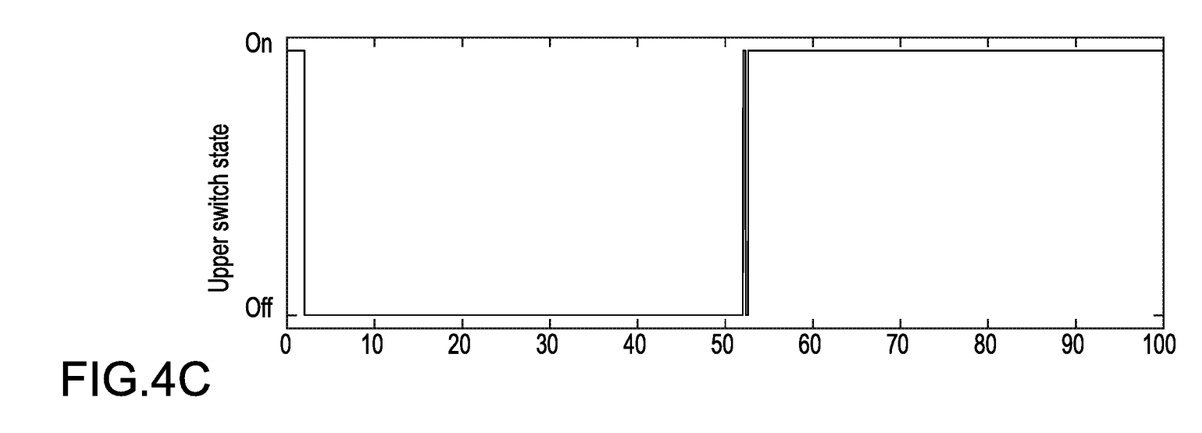
Figure 4D:
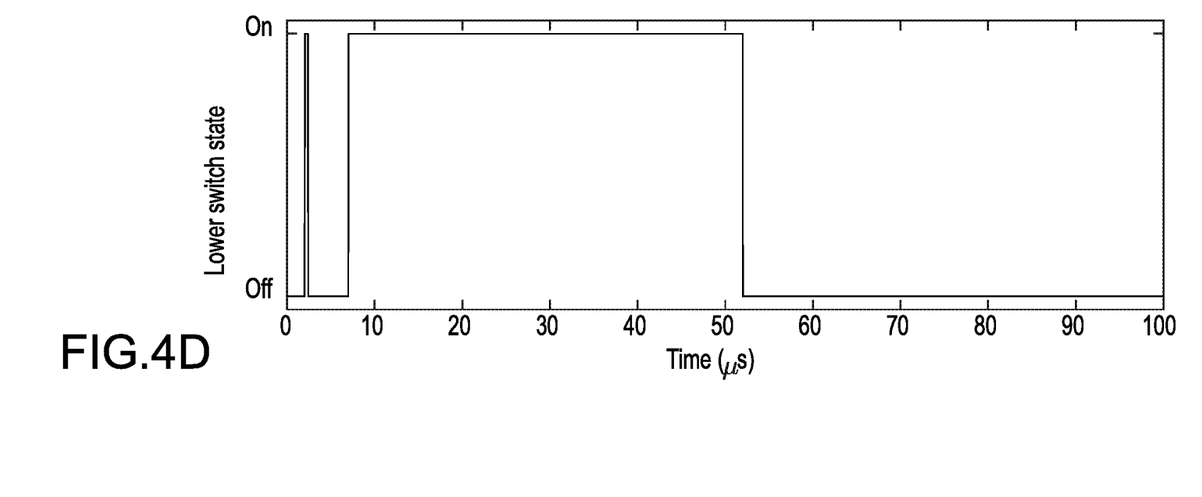

FIG. 3 illustrates a PIN diode driver circuit that includes a large inductor 340 in series between a half bridge and a PIN diode to recover energy from stored charge in a solid state match application. The circuit of FIG. 3 illustrates a circuit diagram for evaluating circuit performance of sequencing the PIN diode bias transitions to recover energy, such as in an implementation for FIG. 1A, and in the example illustrated further adds a relatively large inductor 340 (300 μH) in series between a half bridge formed by switches 315 and 320 and the PIN diode 350 to recover energy from stored charge in an SSM application. The circuit of FIG. 3 can be used to also illustrated the benefit of applying the techniques, with or without a relatively large inductor depending on the circumstances, to the circuits of FIGS. 1A and 1B, and similar such circuits. FIG. 4 shows performance waveforms of the circuit of FIG. 3 with switches operated to recover energy from stored charges in a solid state match application. The use of the unique bias sequencing and the large inductor in series between the half bridge circuit and the PIN diode allows the driver circuit to recover some energy stored in capacitors of the SSM application for high speed, high repetition rate, and/or high power RF applications.

The performance waveforms 400 illustrate driver circuit performance based on unique sequencing of the forward bias supply (e.g., current supply) to the PIN diode and the switch to provide a high reverse bias voltage to the PIN diode. Referring to FIG. 3, for example, a controller 302 (or, controller 102 in FIG. 1A or 103 in FIG. 1B) or other circuit may control switch 315 and switch 320 to turn off the PIN diode and utilize the large inductor 340 to recovery energy from stored charge of the PIN diode itself as well as capacitor 360 connected to the PIN diode if in an SSM application.

Figure 5:
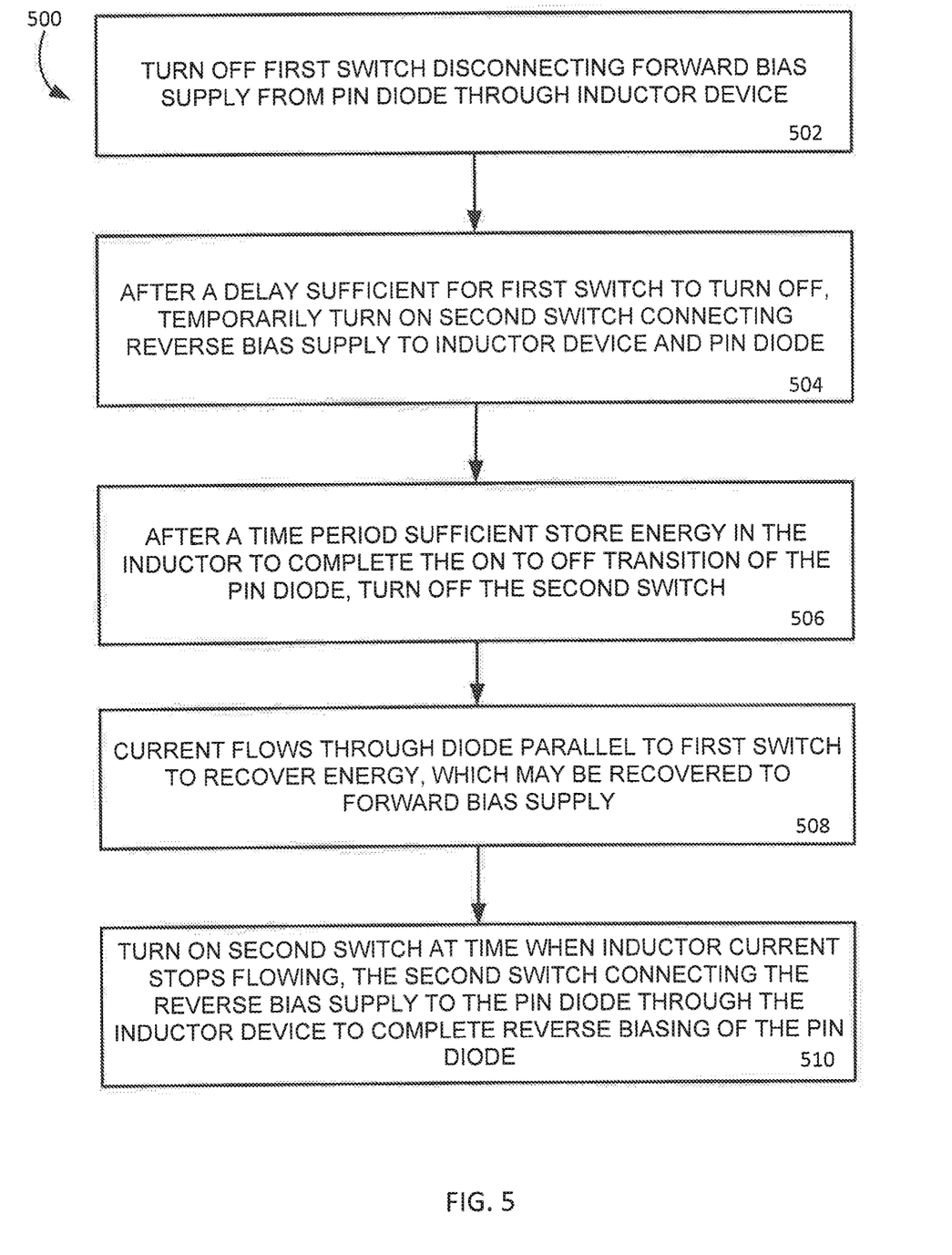
FIG. 5 is a method for controlling the switches of the circuit of FIG. 3 to turn the PIN diode off in such a way as to recover energy from stored charge in a solid state match application.

FIG. 5 illustrates one example of a method of controlling the switches of the PIN diode driver circuit to recover energy from the forward to reverse bias transition of the circuit of FIG. 3. As such, the operations of the method 500 may be performed by the controller 302 of the switch devices 315 and 320 to forward bias and reverse bias the PIN diode. For purposes of discussion, the method begins from a state where the forward bias supply is connected to the PIN diode. Beginning in operation 502, the controller opens a first switch (e.g., 315) (which may be referred to as a first semiconductor switch device such as various possible forms of transistor devices) disconnecting the forward bias supply (e.g., low voltage current supply 305) from the inductor and PIN diode 350. The method, at operation 504, then momentarily turns on the second switch 320, which may similarly be referred to as a second semiconductor switch device, to momentarily connect the high voltage reverse bias supply 310 to the inductor 340 and PIN diode 350 before then disconnecting the high voltage supply.

Referencing FIG. 3 and the waveforms of FIGS. 6A-6D, the first switch 315 (upper switch) may be opened, which disconnects the low voltage current supply 305 from the inductor 340 and the PIN diode 350. After a delay (604) large enough to allow the first switch 315 to open, the second switch 320 (lower switch) is momentarily closed connecting the high voltage supply 310 to the PIN diode 350 through inductor 340. The delay 604 is generally long enough for the current through the inductor 340 to reverse as a result of a large negative voltage swing at the junction of switches 315 and 320. The reverse bias voltage, which may be −1500 V in one example, reverses (if not already reversed during the delay 604) the preceding bias current flow through the inductor from the capacitor 360 and PIN diode 350. In some cases, connecting the reverse bias supply increases the magnitude of the reverse current if the current reversed in the period 604, which can happen depending on choice of component values and length of delay 604. Due to the characteristics of an inductive device, such as the inductor 340, reverse current is maintained when switch 320 is subsequently opened at 608. Thus, when the reverse bias voltage is disconnected, reverse current flow to the forward bias supply 305 through diode 325 and energy is recovered to the low voltage supply.

In more detail, referring to FIG. 3, when switch 320 (lower switch) is turned off or opened (608), the reverse current (610) flows through diode 325 (upper diode) parallel to switch 315 (upper switch) (operation 508). As noted, diode 325 (upper diode) may be the intrinsic diode of the device (e.g. MOSFET) of switch 315, or may be a discrete diode. During the time of reverse current flow, energy is recovered to the low voltage power supply (e.g., 305). In some instances, the switch 315 may be closed during this period to improve the energy recovery efficiency of the modified PIN diode driver circuit. In effect, reverse (energy recovery) current 610 may flow through the diode and through a parallel path through the first semiconductor switch to recover energy at the supply 305. In operation 510, switch 320 is turned back on (612) when the inductor current 610 stops flowing. If the time period during which 320 was on (from just after delay 604 to 608) to increase the inductor current magnitude for use in operating the PIN diode was sufficient, the average voltage over the PIN diode (i.e. the voltage with the superimposed RF voltage averaged out) provided by the inductor will be close to the voltage of the high voltage power supply when switch 320 is turned back on. In this manner, the operation of the switches in the driver circuit allows for driving the PIN diode while simultaneously recovering energy from the stored charge in the PIN diode (and in capacitors 360 attached to the PIN diode in SSM applications).

Figure 6A:
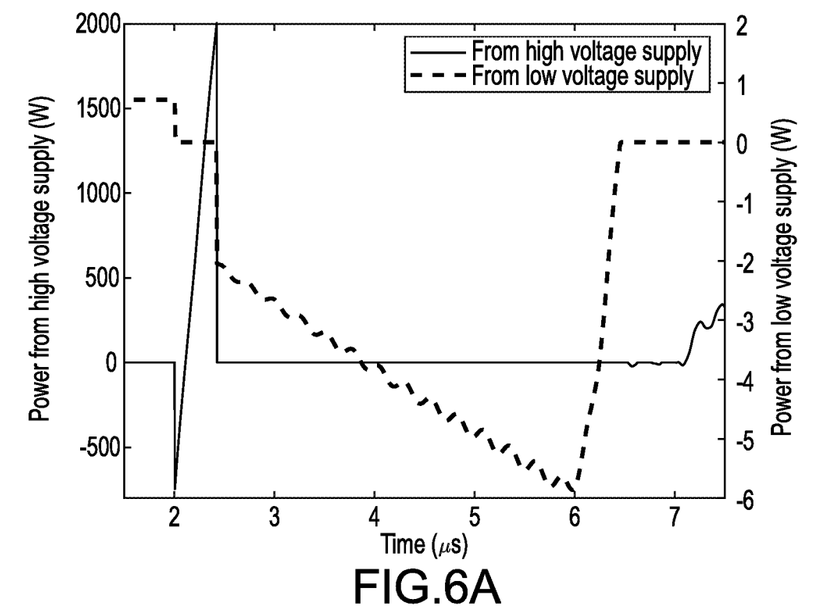
FIG. 6 illustrates turn-on waveforms for the circuit of FIG. 3 with switches operated in such a way as to recover energy from stored charge in a solid state match application.
Figure 6B:
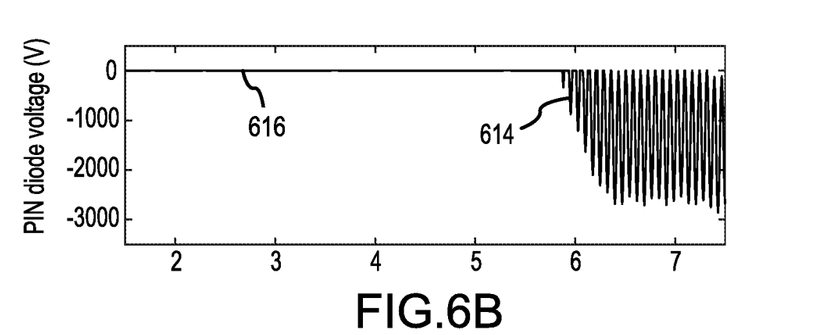
Figure 6C:
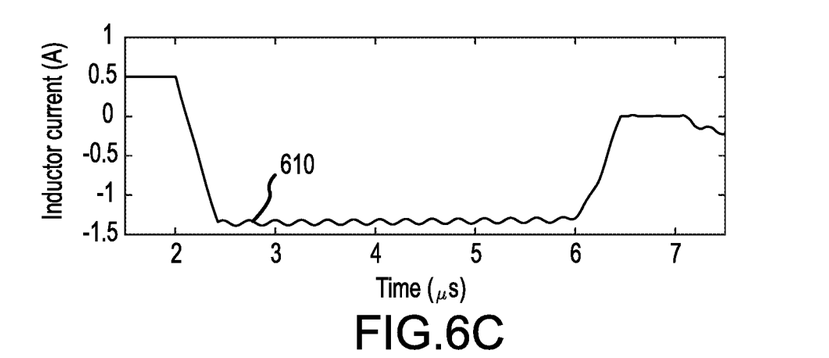
Figure 6D:
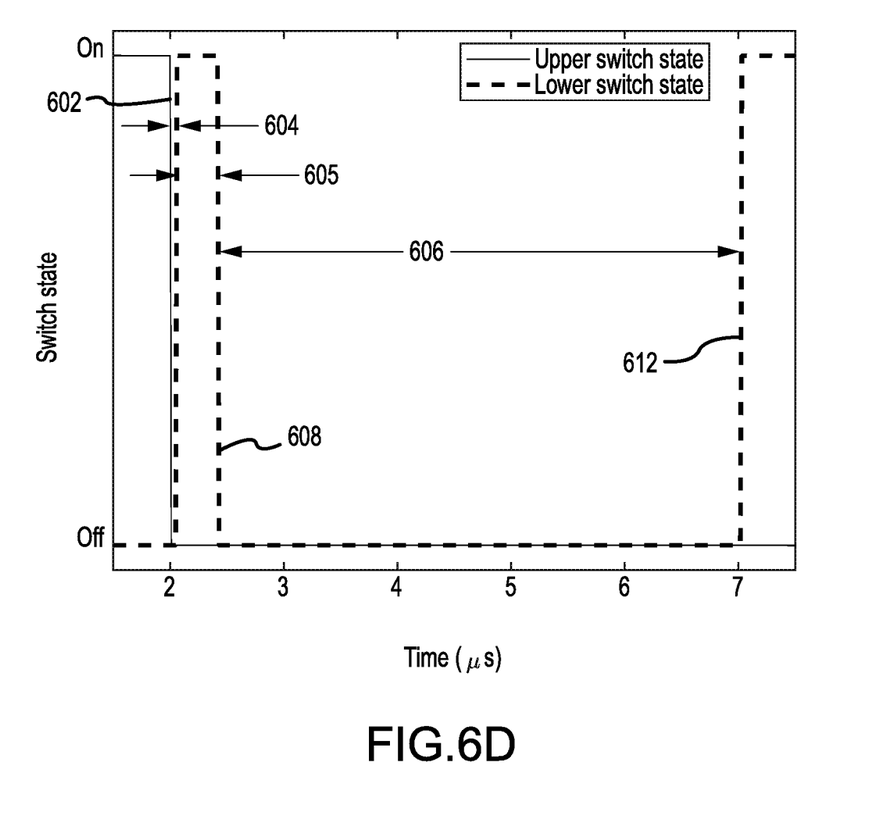

Referring to FIG. 6C, there is a relatively long time period (from 2 µs to 6 µs) during which the PIN diode voltage 616 remains around +0.7 V even though the forward bias was removed at 602 (FIG. 6D). During this time period, the charge that had accumulated during forward bias, which can be considered equal to the forward current times the carrier lifetime which in this circuit is 0.5 A×12 µC=6 µC, is removed from the PIN diode. Had this charge been removed by keeping switch 320 on (not turning off at 608 for the duration 606), an energy of 6 µC×1500 V=9 mJ would be consumed; instead, an energy of approximately 6 µC×6 V=36 µJ is recovered during this time period assuming the low voltage supply 305 clamps at 6 V when the current flow is reversed. The net energy recovered during this on to off transition of the PIN diode is generally negative since the high voltage supply supplies a large amount of energy to increase the inductor current. The power taken from the reverse bias supply 310 is shown in FIG. 6A. Note, the power being taken from the reverse bias supply 310 ramps up during the short period that the reverse bias supply is connected 605 but falls to zero when switch 320 is opened (608) disconnecting the reverse bias supply. The integrals of the waveforms in FIG. 6A are the energies taken from the supplies 305 and 310 in the process of reverse biasing the PIN diode. Notice that the energy taken from the low voltage forward bias supply 305 is negative indicating that energy is recovered to the forward bias supply. The energy taken from the high voltage reverse bias supply is positive and higher than the energy recovered to the forward bias supply, but most of this difference is stored in the capacitors and most of this energy is recovered to the reverse bias supply when the diode state is changed back from the off to the on state.

Figure 7:
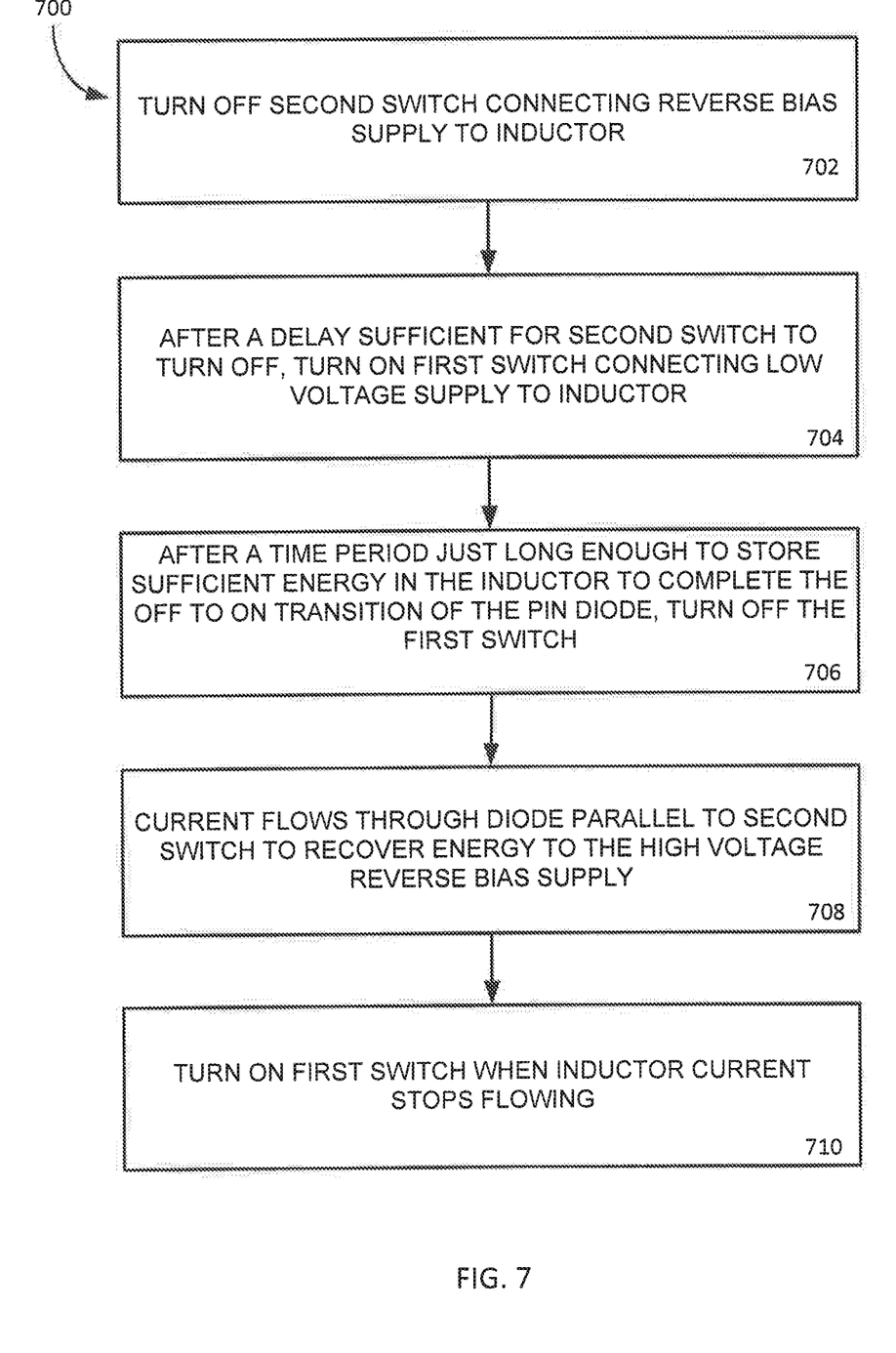
FIG. 7 is a method for controlling the switches of the circuit of FIG. 3 to turn the PIN diode on in such a way as to recover energy from stored charge in a solid state match application

FIG. 7 illustrates a method 700 for the control of the switches of the PIN diode driver circuit to switch the PIN diode from reverse bias to forward bias in a manner to provide energy recovery. FIG. 8 shows the resulting waveforms. Referring to FIG. 3, in the initial state, the PIN diode 350 is reversed biased with switch 315 open and switch 320 closed and the high voltage reverse bias supply 310 connected; beginning in operation 702, the controller opens switch 320 (see 800, FIG. 8D). After a delay (802) sufficient to allow the switch 320 to turn off, the switch 315 is closed 816 connecting the forward bias supply 305 to the PIN diode through the inductor 340 (operation 704). Connecting the forward bias supply to the inductor initiates a forward current 814 and begins to store energy in the inductor and initiate forward biasing the PIN diode. After a time period sufficient to store enough energy in the inductor to complete the off to on transition of the PIN diode, the controller opens switch 315 (806).

When switch 315 is opened, the forward bias current is maintained, albeit at a decreasing level (see, FIG. 8C, 818), by the inductor 340, and current flows through diode 330 parallel to switch 320 (operation 708). Diode 330 may be the intrinsic diode of the device, or may be a discrete diode. During the time of operation 708, energy is recovered to the high voltage power supply 310. In some instances, the switch 320 may be turned on during this period, but it is likely not necessary since the diode drop is generally small compared to the high voltage supply voltage. In operation 710, the switch 315 is closed (808) when the inductor 340 current drops below a threshold or stops flowing (810) or when the current equals the desired forward bias current. If the time period during which the switch 315 was closed to increase the inductor 340 current for use in operating the PIN diode was sufficient, the PIN diode voltage 355 (812) will be close to the forward voltage of the PIN diode when the switch 315 is turned back on (808). In this manner, the operation of the switches in the driver circuit allows for driving the PIN diode while simultaneously recovering energy from stored charge in the PIN diode (and other capacitors connected to the PIN diode in the application, e.g. in a SSM application).

Figure 8A:
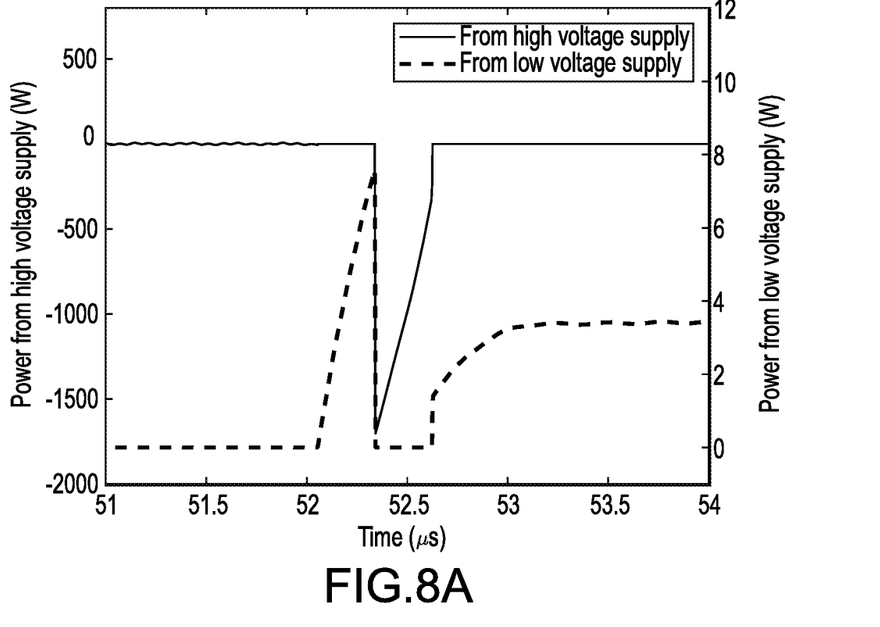
FIG. 8 illustrates turn-off waveforms for the circuit of FIG. 3 with switches operated in such a way as to recover energy from stored charge in a solid state match application.
Figure 8B:
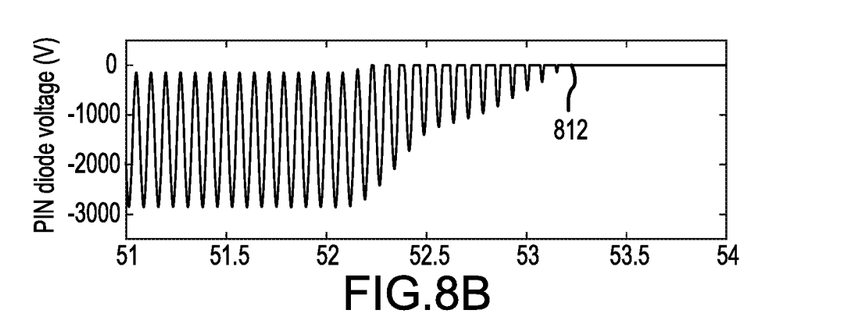
Figure 8C:
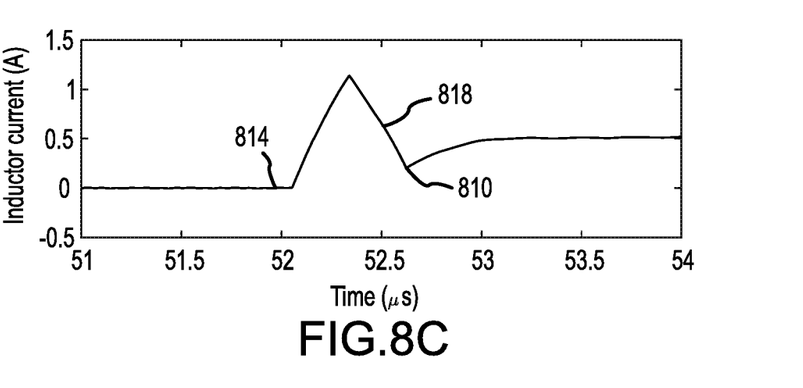
Figure 8D:
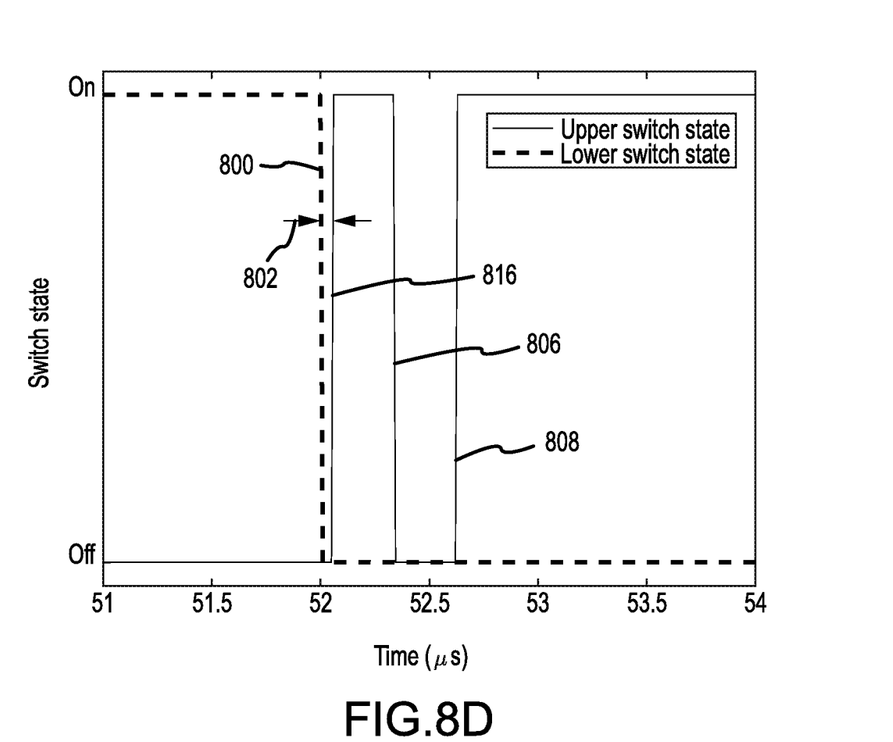

FIG. 8A shows the power taken from the (e.g. −1500 V) reverse bias supply 310 during the off to on state transition of the PIN diode 350. The integral of this waveform is the energy taken form the reverse bias supply 310. This energy is negative and represents recovery of the energy stored when the PIN diode previously transitioned from the on to the off state. FIG. 8A also shows the power taken from the forward bias power supply during the transition of the PIN diode from the off to the on state. The integral of this waveform is the energy taken from the power supply during this transition. This energy is positive and is recovered in a subsequent transition from the on to the off state.

FIG. 8 illustrates turn-on waveforms for the circuit of FIG. 3 with switches operated to recover energy from stored charge in a solid state match application. The PIN diode model used in the simulation simulates a diode with an off state capacitance of 2.9 pF and a carrier lifetime of 12 µs. At 0.5 A, a charge of 6 µC is thus stored in the PIN diode. The PIN diode voltage drop at 0.5 A in this model is 0.75 V, so in the on state the PIN diode stores 0.75 V×6 µC=4.5 µJ. (In the on state other capacitors in the circuit store insignificant amounts of energy.) In addition, with the large inductor set to 300 µH and with an additional 30 µH in the RF blocking device, and additional 0.5 (300+30) $10^{-6}$ $0.5^2 \approx 41$ µJ is stored in the inductors in the on state. In the off state the diode and capacitors in the circuit 300 store 0.5 (2.9+180+56)$10^{-12}$ $1500^2 \approx 269$ µJ. (The capacitor 360 in simulations was set to 180 pF and the RF blocking device 345 contains a 56 pF capacitor to ground.) Thus, the stored energy in the circuit 300 increases by approximately (269−(4.5+41)) µJ≈224 µJ when going from the on state to the off state of the PIN diode. (These statements assume averages over the duration of an RF cycle, or that the RF source 365 amplitude is negligible.)

With no RF applied to the circuit, simulations show that 292 µJ is used to turn off the PIN diode (130% of 224 µJ) and during turn on, 252 µJ (113% of 224 µJ) is recovered. Thus 86% of the supplied 292 µJ is recovered if no RF is applied. The failure to recover all the energy is due to the non-ideal nature of the components modeled as well as a deliberate dampening resistor inserted in the circuit. Despite the imperfections, the controller and operation of driver circuit described herein consumes only 40 µJ. Thus, 30 such switches operating at 10 kHz would consume only 6 W. (Both transitions happen at a 5 kHz rate.)

With a 1400 V RF amplitude (RF source 365 in circuit 300 set to 1400 V amplitude), independent of the phase of the RF relative to the switch timing, 386 µJ (172% of 224 µJ) is supplied to turn off the PIN diode and 293 µJ (130% of 224 µJ) is recovered when turning on the PIN diode. Thus 76% of the supplied 386 µJ is recovered. With RF applied, this circuit consumes only 93 µJ. Thus 30 such switches operating at 10 kHz would consume only 14 W, a large improvement over the 1350 W consumption for a typical SSM application utilizing a typical PIN diode driver circuit.

The simulation results described in the previous paragraphs assume a simple PIN diode model where it is possible to extract all the charge form the PIN diode while the PIN diode voltage remains at a nominal on voltage of approximately 0.7 V. Using more sophisticated PIN diode models that model the charge distribution in the diode more thoroughly it is clear that in many cases this is not possible. The more sophisticated models show that charge may be completely extracted from the edges of the I-region while charge remains in the center of the I-region. The region where the charge is fully extracted sets up a space charge region leading to an increase in diode reverse voltage before all the charges are extracted. This behavior reduces the performance of the circuit, but compared to standard PIN diode drivers, the modified PIN diode driver described here still achieves significantly better results. For example, in a typical example, waiting 200 ns after turning off the forward bias current before turning on the high voltage reverse bias supply may require 7.3 mJ, waiting 10 µs after turning off the forward bias current before turning on the high voltage reverse bias supply may require 4.8 mJ, adding a large (300 mH) inductor in addition to waiting 10 µs may require 4.4 mJ, and adding the switching sequence described here may require 1.3 mJ. This result can be compared to the previous result predicted using a simple PIN diode model that predicts that 93 µJ is required. Thus, the more accurate model predicts almost 14 times as much power is required than the simple model, but still predicts a 3.7 fold or more power saving compared to a conventional PIN diode driver.

Figure 9:
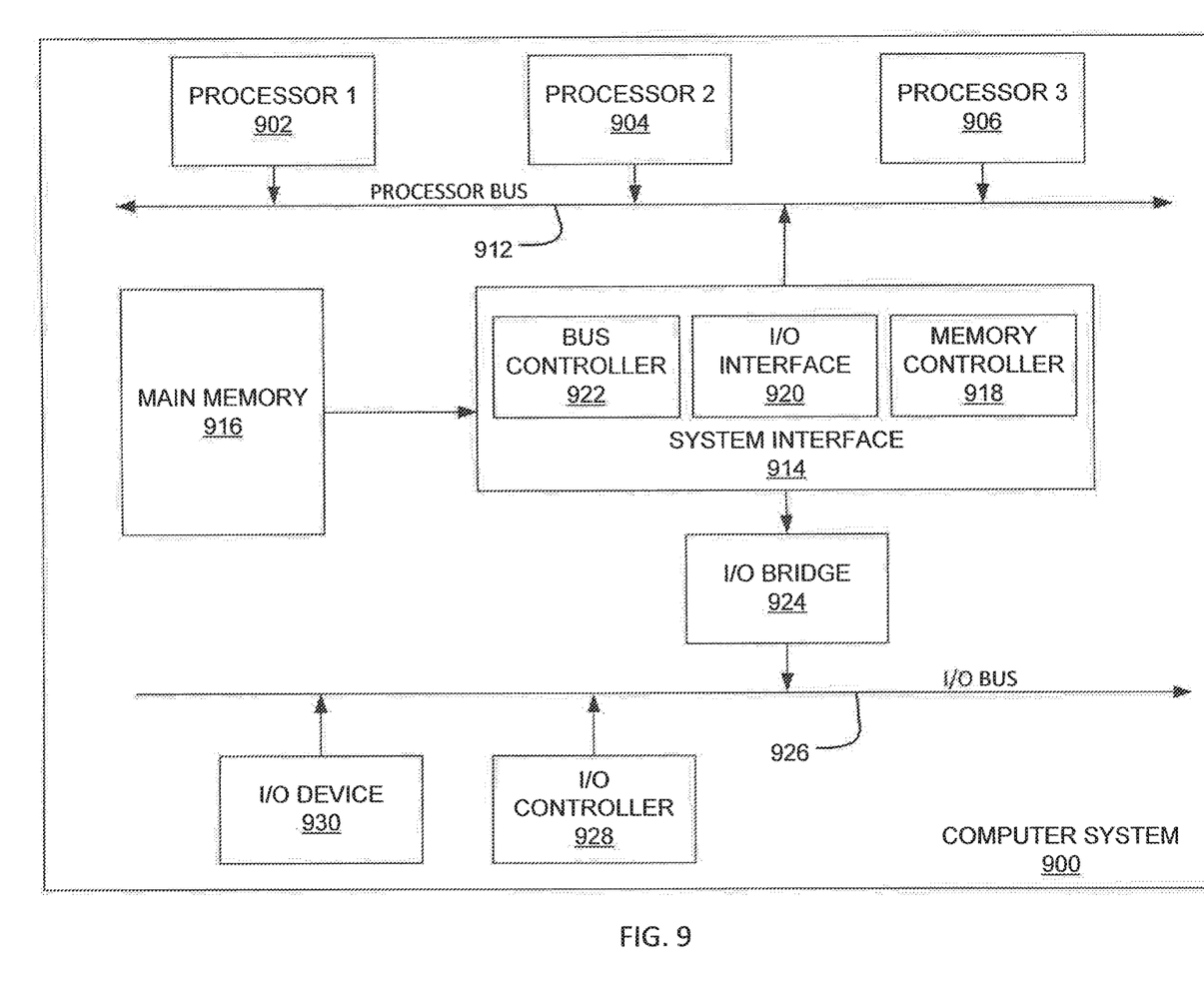
FIG. 9 is a diagram illustrating an example of a computing system which may be used in implementing embodiments of the present disclosure.

FIG. 9 is a block diagram illustrating an example of a computing device or computer system 900 which may be used in implementing the controller, for example. The controller may also be integrated with an RF power supply, or other form of supply, integrated in an impedance matching network, or otherwise be provided in various possible forms. Referring to the example of FIG. 9, the computing system 900 may be a control device for providing any controlling signal to any of the switching devices for the driver circuits discussed above. The computer system (system) includes one or more processors 902-906. Processors 902-906 may include one or more internal levels of cache (not shown) and a bus controller or bus interface unit to direct interaction with the processor bus 912. Processor bus 912, also known as the host bus or the front side bus, may be used to couple the processors 902-906 with the system interface 914. System interface 914 may be connected to the processor bus 912 to interface other components of the system 900 with the processor bus 912. For example, system interface 914 may include a memory controller 918 for interfacing a main memory 916 with the processor bus 912. The main memory 916 typically includes one or more memory cards and a control circuit (not shown). System interface 914 may also include an input/output (I/O) interface 920 to interface one or more I/O bridges or I/O devices with the processor bus 912. One or more I/O controllers and/or I/O devices may be connected with the I/O bus 926, such as I/O controller 928 and I/O device 930, as illustrated. The system interface 914 may further include a bus controller 922 to interact with processor bus 912 and/or I/O bus 926.

I/O device 930 may also include an input device (not shown), such as an alphanumeric input device, including alphanumeric and other keys for communicating information and/or command selections to the processors 902-906. Another type of user input device includes cursor control, such as a mouse, a trackball, or cursor direction keys for communicating direction information and command selections to the processors 902-906 and for controlling cursor movement on the display device.

System 900 may include a dynamic storage device, referred to as main memory 916, or a random access memory (RAM) or other computer-readable devices coupled to the processor bus 912 for storing information and instructions to be executed by the processors 902-906. Main memory 916 also may be used for storing temporary variables or other intermediate information during execution of instructions by the processors 902-906. System 900 may include a read only memory (ROM) and/or other static storage device coupled to the processor bus 912 for storing static information and instructions for the processors 902-906. The system set forth in FIG. 9 is but one possible example of a computer system that may employ or be configured in accordance with aspects of the present disclosure.

According to one embodiment, the above techniques may be performed by computer system 900 in response to processor 904 executing one or more sequences of one or more instructions contained in main memory 916. These instructions may be read into main memory 916 from another machine-readable medium, such as a storage device. Execution of the sequences of instructions contained in main memory 916 may cause processors 902-906 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 916. Common forms of machine-readable medium may include, but is not limited to, magnetic storage medium; optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

The description above includes example systems, methods, techniques, instruction sequences, and/or computer program products that embody techniques of the present disclosure. However, it is understood that the described disclosure may be practiced without these specific details. In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages should be understood by the foregoing description, and it should be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it should be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

I claim:

1. A method for driving a PIN diode, the method comprising:
in a circuit including an inductor device switchably connectable between a forward bias supply and a PIN diode using a first switch and between a reverse bias supply and the PIN diode using a second switch;
opening the first switch to disconnect the forward bias supply from the inductor device and the PIN diode;
after the opening of the first switch, closing the second switch to connect the reverse bias supply to the inductor device and the PIN diode to initiate reverse biasing of the PIN diode; and
during reverse biasing of the PIN diode and in the presence of a reverse current, opening the second switch to recover energy to the forward bias supply.

2. The method of claim 1 wherein opening the second switch to recover energy to the forward bias supply occurs after a time period sufficient for the inductor device to store sufficient energy for a transition of the PIN diode from a forward bias state to a reverse bias state.

3. The method of claim 1 further comprising closing the second switch to reconnect the reverse bias supply to the inductor device to complete the reverse biasing of the PIN diode.

4. The method of claim 1 wherein the energy being recovered is from a stored charge of the PIN diode.

5. The method of claim 1 wherein the circuit further comprising a capacitor operably coupled with the PIN diode as part of a match network, the PIN diode connecting the capacitor in the match network when forward biased and disconnecting the capacitor from the match network when reverse biased, the energy recovered further being a stored charge of the capacitor.

6. The method of claim 1 wherein the circuit includes a diode parallel with the first switch, the reverse current flowing through the diode to the forward bias supply.

7. The method of claim 6 wherein the diode is a body diode of the first switch.

8. The method of claim 6 further comprising closing the first switch to provide an additional path for the reverse current to the forward bias supply.

9. A method for driving a PIN diode, the method comprising:
in a circuit including an inductor device switchably connectable between a PIN diode and a forward bias supply using a first switch, and connectable between the PIN diode and a reverse bias supply using a second switch;
opening the second switch to disconnect the reverse bias supply from the PIN diode;
after opening the second switch, closing the first switch to connect the forward bias supply to the inductor device and the PIN diode; and
during forward bias of the PIN diode, opening the first switch to provide energy recovery to the reverse bias supply.

10. The method of claim 9 wherein opening the first switch to provide energy recovery to the reverse bias supply occurs after a time period sufficient for the inductor device to store sufficient energy for a transition of the PIN diode from a reverse bias state to a forward bias state.

11. The method of claim 9 further comprising:
closing the first switch to reconnect the forward bias supply to the inductor device and the PIN diode when a current through the inductor is about zero or at a forward bias current.

12. An apparatus comprising:
a controller coupled with a first semiconductor switch device and a second semiconductor switch device, the first semiconductor switch device to connect a forward bias supply with an inductor device in series with a PIN diode, the second semiconductor switch device to connect a reverse bias supply with the inductor device in series with the PIN diode, the controller including instructions to:
in reverse biasing the PIN diode, after opening the first semiconductor switch device, close the second semiconductor switch device to connect the reverse bias supply to the inductor device and the PIN diode to initiate reverse biasing of the PIN diode; and
during reverse biasing of the PIN diode and in the presence of a reverse current, open the second semiconductor switch device to recover energy to the forward bias supply.

13. The apparatus of claim 12 wherein opening the second semiconductor switch device to recover energy to the forward bias supply occurs after a time period sufficient for the inductor device to store sufficient energy for a transition of the PIN diode from a forward bias state to a reverse bias state.

14. The apparatus of claim 12 further comprising closing the second semiconductor switch device to reconnect the reverse bias supply to the inductor device to complete the reverse biasing of the PIN diode.

15. The apparatus of claim 12 in forward biasing the PIN diode, the controller including instructions to:
- open the second semiconductor switch device to disconnect the reverse bias supply from the inductor device and the PIN diode;
- after opening the second semiconductor switch device, close the first semiconductor switch device to connect the forward bias supply to the inductor device and the PIN diode; and
- during forward biasing of the PIN diode, open the first semiconductor switch device to provide energy recovery to the reverse bias supply.

16. The apparatus of claim 15 wherein opening the first semiconductor switch device to provide energy recovery to the reverse bias supply occurs after a time period sufficient for the inductor device to store sufficient energy for a transition of the PIN diode from a reverse bias to a forward bias state.

17. The apparatus of claim 15 the controller further including instructions, during forward biasing of the PIN diode, to close the first semiconductor switch device to reconnect the forward bias supply to the inductor device and the PIN diode when a current through the inductor is about zero or at a forward bias current.

* * * * *